United States Patent [19]

Bruce et al.

[11] Patent Number: 4,980,888

[45] Date of Patent: Dec. 25, 1990

[54] MEMORY TESTING SYSTEM

[75] Inventors: William Bruce, Lunenburg; Donald W. Smelser, Bolton, both of Mass.

[73] Assignee: Digital Equipment Corporation, Maynard, Mass.

[21] Appl. No.: 243,463

[22] Filed: Sep. 12, 1988

[51] Int. Cl.⁵ .................. G01R 31/28; G06F 11/00
[52] U.S. Cl. ................................ 371/21.1; 371/21.2
[58] Field of Search .............. 371/21.1, 21.2, 22.4; 365/201

[56] References Cited

U.S. PATENT DOCUMENTS

| | | | |
|---|---|---|---|
| 4,622,668 | 11/1986 | Dancker et al. | 371/20 |
| 4,672,583 | 6/1987 | Nakaizumi | 365/201 |
| 4,715,034 | 12/1987 | Jacobson | 371/21 |
| 4,757,503 | 7/1988 | Hayes et al. | 371/21 |
| 4,758,992 | 7/1988 | Taguchi | 365/201 |
| 4,827,476 | 5/1989 | Garcia | 371/21 |

*Primary Examiner*—Charles E. Atkinson
*Attorney, Agent, or Firm*—Nutter, McClennen & Fish

[57] ABSTRACT

A DRAM test system includes a storage location tester and controller tester. The storage location tester utilizes an error correction code which generates redundancy symbols corresponding to inverted data that are the binary inverse or compliment of the redundancy symbols corresponding to the non-inverted data. Thus each bit-location of an addressable storage location, consisting of both data and ECC redundancy bit locations, can be fully tested for storage and retrieval of both a ONE and a ZERO in only three read/write cycles. The controller tester tests the DRAM controller circuitry by sequencing it through various operations, at least one of which is a refresh operation. When a refresh operation occurs the node signals corresponding to the refresh operation are incorporated into a DRAM controller signature vector. To counter the effects of the refresh operation on the signature vector, a refresh-vector is applied to the signature vector register during the refresh operation and the contents of the register are updated. This results in the contents of the signature vector being "returned" to the pre-refresh contents at the end of a properly executed refresh. At the completion of the testing cycle the signature vector may then be compared with the expected output vector, which does not include any refresh operation information, to determine if the DRAM is functioning properly.

28 Claims, 2 Drawing Sheets

MEMORY TESTING SYSTEM

FIELD OF INVENTION

The invention relates to the field of computer memories, and more particularly to the testing of the memories.

BACKGROUND

Many devices in computer systems utilize dynamic random access memories (DRAMS). The DRAMS are typically tested each time the system, or a device containing DRAMS, is turned on or "powered up". The tests may be part of a self-evaluation sequence which the system or device performs on various circuits to determine if the circuits are capable of correctly performing specific tasks or series of tasks.

The circuits are typically tested by exercising them, that is, sequencing them through a specific series of operations using predetermined input signal vectors. Signals generated at various internal and/or external nodes of the circuit under test may be monitored throughout the test sequence and, at predetermined points in the sequence, compared with corresponding expected signals. The generated signals and the expected signals will typically match if the circuit is functioning properly.

If a large number of nodes are monitored, the signals may be encoded to produce smaller output, or signature, vectors. The signature vectors can then be compared with similarly encoded expected output signal vectors and the results analyzed to determine if the circuit is functioning properly.

The tests are usually designed such that a circuit is fully exercised, that is, specific operations are performed which utilize the complete range of capabilities of the circuit. To thoroughly test a memory, for example, the memory controller is tested, and each addressable multi-bit memory storage location, as well as the individual bit-storage locations, is tested. The addressable locations are tested to determine if they are properly accessed using the associated addresses, and the bit-storage locations are tested to determine if they are capable of correctly storing both ONES and ZEROS.

The addressable multi-bit memory locations typically store data and associated error correction code (ECC) redundancy bits. Each time data is stored in a memory location the associated ECC bits are also stored therein. Thus, to test a memory location, several read and write operations are required, namely, a write and corresponding read operation to write and then read both a data pattern of ONES and ZEROS and the associated ECC bits; a write and corresponding read operation to write and then read the binary inverse or compliment of both the data pattern and the ECC bits associated with the inverted data; and a series of operations to test each ECC bit location by writing and reading data which will result in each of the ECC bit locations storing both a ONE and a ZERO.

As the memories become larger and larger, sequentially testing each addressable storage location and each bit-storage location takes more and more time. Thus a test which reads and writes the addressable storage locations and tests each bit-storage location, including ECC bit storage locations, in a shorter period of time using fewer write and read operations is desirable.

Testing sequences for DRAMS are typically quite complex and time consuming because of the DRAMS' dynamic refresh operations. Refresh operations are controlled exclusively by the characteristics of the DRAM and are performed at times dictated by an associated timer. Thus the DRAM may already be engaged in any number of system-controlled activities, including testing, when a refresh operation is to be performed. The refresh operation may alter the node signals that make up an output vector. Accordingly, the test output vector may not match the expected output vector, even if the circuit is functioning properly.

Moreover, to completely test the DRAM, the refresh operation should be tested, also. If the DRAM is otherwise functioning properly but has a faulty refresh cycle, stored data may be lost. Thus a test which includes the refresh operation and also provides output vectors unaffected by the refresh operation is desirable.

SUMMARY

A DRAM test system embodying the invention includes a storage location tester and a controller tester. The storage location tester utilizes a scheme in which the error correction code used to generate the redundancy symbols is chosen such that the redundancy symbols corresponding to inverted data are the binary inverse or compliment of the redundancy symbols corresponding to the non-inverted data. Thus each bit-location of an addressable storage location, consisting of both data and ECC redundancy bit locations, can be fully tested in only three read/write cycles. That is, with three cycles, each bit-location in a multi-bit addressable storage location is tested for storage and retrieval of both a ONE and a ZERO.

More specifically, the testing sequence includes:

a first read/write cycle involving — i) reading the DRAM locations using a pseudo-random series of addresses, ignoring the data during this read operation, and ii) writing data and corresponding ECC redundancy bits to the addressable locations;

a second read/write cycle involving — i) reading the data and the ECC redundancy bits from the pseudo-random series of storage locations, checking them for errors, and ii) if no errors are found (indicating a correctly executed storage operation) inverting the data, calculating the ECC redundancy bits for the inverted data, and writing both to the addressed location, or iii) if errors are found, (indicating an incorrectly executed storage operation) writing the same data and a selectively complimented version of the corresponding ECC redundancy bits to the storage location; and a third read/write cycle involving — i) reading the data and ECC redundancy bits from each storage location and checking them for errors, and ii) if no errors are found, writing all-ZERO data and corresponding ECC redundancy bits to the storage location, or iii) if errors are found, writing the same data and the selectively complimented version of the ECC redundancy bits to the storage location. The storage location tester thus tests each bit-storage location using a minimal number of read/write cycles.

The controller tester tests the DRAM controller circuitry by sequencing it through various operations, at least one of which is a refresh operation. When a refresh operation occurs the node signals corresponding to the refresh operation are incorporated into a DRAM controller signature vector. A properly executed refresh operation results in applying a series of known signals to the various monitored nodes and thus the DRAM controller signature vector register is updated in a known manner. To counter the effects of the refresh operation on the signature vector, a refresh-vector is applied to the signature vector register during the refresh operation and the contents of the register are updated.

If the refresh operation is properly executed, so updating the register results in the contents of the signature vector register being "returned" to the pre-refresh contents at the end of the operation. Thus at the completion of the test cycle the signature vector can be compared with the expected output vector, which does not include any refresh operation information, to determine if the DRAM is functioning properly. If the refresh operation is not executed properly, so updating the signature vector register does not "return" the register contents to the pre-refresh signature vector. Thus the signature vector will not match the expected output vector at the end of the test cycle.

DESCRIPTION OF THE DRAWINGS

For a more complete understanding of the features, advantages, and objects of the invention, reference should be made to the following detailed description and the accompanying drawings, in which.

DETAILED DESCRIPTION

Figure 1:
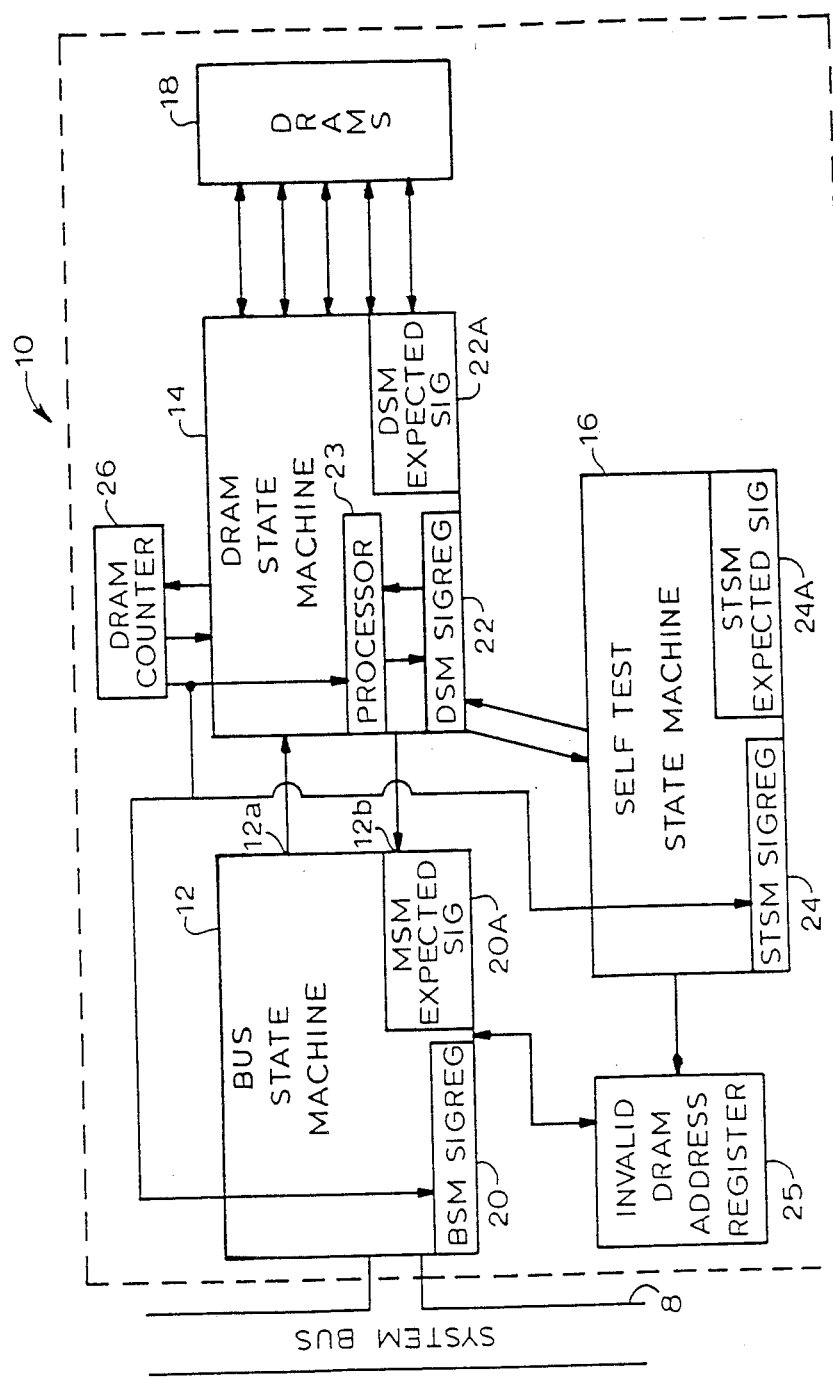
FIG. 1 is a functional block diagram of a DRAM controller chip constructed in accordance with the invention depicting three controller state machines including a self test state machine.

With reference to FIG. 1, a DRAM memory module 10 includes a DRAM 18 and three controller state machines, namely a Bus State Machine 12, a DRAM State Machine 14 and a Self Test State Machine 16. The Bus State Machine 12 controls the transfer of data to and from a system bus 8, and the DRAM State Machine 14 controls the transfer of data between the DRAM 18 and the Bus State Machine 12. The Self Test State Machine 16 controls the testing of the DRAM 18, through the DRAM State Machine 14, as discussed in more detail with reference to FIG. 2.

When the DRAM memory module 10 is powered up, or brought on-line with the system bus 8, the module 10 is tested. Specifically, each state machine 12, 14 and 16 is tested to determine if the machine can correctly perform its various operations, and the DRAM 18 is tested to determine if it can properly store and retrieve data signals.

The state machines 12, 14 and 16 are tested by sequencing them through a series of operations using known input signal vectors. Signals generated at various state machine circuit internal and/or external nodes, for example, node 12b, are monitored and encoded to produce test signature vectors for each of the state machines 12, 14, 16.

The respective state machine signature vectors are captured in a MSM signature register 20, a DSM signature register 22 and a STSM signature register 24. The signature registers 20, 22 and 24 are multi-input, multi-stage linear feedback shift registers, of conventional design, which encode the node signals using prime polynomials. They encode the signals such that each signature vector is unique in the sense that identical signature vectors will be generated only if the register inputs are identical or significantly different. Thus it is very unlikely that a test signature vector generated for an improperly operating circuit will match the signature vector produced by a properly operating circuit.

At the completion of testing the state machine signature vectors contained in the respective signature registers 20, 22, and 24 are compared with corresponding expected signature vectors stored in expected signature registers 20A, 22A and 24A. If the signature vector for a particular state machine matches the corresponding expected signature vector the machine is assumed to be operating properly. If the vectors do not match, the corresponding state machine is assumed to be improperly operating and an error message is sent to a system processor (not shown).

Testing each of the state machines using only one signature vector simplifies the test evaluation and reduces storage requirements associated with the testing. A state machine is evaluated for improper operation, though not for what is causing the improper operation, by comparing two vectors. This comparison may be easily performed by XOR'ing the vectors. Thus the test cycle does not require elaborate circuitry for evaluating the results.

The DRAM State Machine 14 controls the DRAM 18 refresh operation based in large part on a DRAM timer 26. A refresh operation is performed each time the DRAM timer 26 exceeds a predetermined time. The refresh operation is usually "hidden", that is, it is performed when the DRAM is in between storage and retrieval operations. Thus once the DRAM timer 26 reaches a predetermined time a refresh operation will be performed when the DRAM is next otherwise idle. If a hidden refresh operation has not been performed before the expiration of the DRAM timer 26 a refresh operation is forced, that is, the DRAM storage or retrieval operations are interrupted, the Bus State Machine and the Self Test State Machine are idled and a refresh operation is performed. The DRAM timer 26 is clocked by the DRAM State Machine 14, and thus it operates asynchronously from the other state machines 12 and 16 and also from the system bus 8. Accordingly, refresh operations may be required any number of times during testing.

A hidden refresh operation is not typically performed during the testing sequence because the DRAM is continuously busy performing storage and retrieval operations ordered by the Bus State Machine 12 and the Self Test State Machine 16. Thus when the DRAM timer 26 expires, and a refresh operation is forced, it disables the BSM signature register 20 and the STSM signature register 24 to prevent them from registering the forced idle or waiting states of the respective state machines. The forced refresh operation, which functions exactly the same as any other refresh operation is then performed.

The DRAM State Machine 14 internal and/or external circuit nodes generate various signals during the refresh operation. These signals are applied to the DSM signature register 22 and the contents of the signature register are correspondingly updated. Each properly executed refresh operation results in the DRAM State Machine 14 generating the same series of signals at the monitored nodes. Thus, for example, if the contents of the signature register 22 are known at the start of the refresh operation the contents of the register 22 at the end of a proper refresh operation are also known.

To counter the effect of a refresh operation on the contents of the DSM signature register 22 a refresh-vector is applied to the register 22 during each refresh cycle. The refresh-vector is generated by a DRAM processor 23 using the contents of the DSM signature register 22 at a predetermined point in the refresh operation and the known series of node signals produced during the operation. The processor, in effect, uses the contents of the signature register 22 to determine what the pre-refresh signature vector must have been to result in the current register contents, assuming the refresh operation is correctly performed to this point. The processor then calculates what the contents of the register must be to result in a signature vector equal to this pre-refresh value at the completion of a properly executed refresh operation. It then applies a refresh-vector to the register 22 to force the contents to the calculated value. In the preferred embodiment the refresh-vector is applied to the DSM signature register 22 as the first step of the refresh operation. Thus the pre-refresh signature vector is known and only the refresh-vector is calculated.

If the refresh operation is not properly executed, the various node signals applied to DSM register 22 throughout the refresh operation will not be the same as the signals used by the DRAM processor 23 to generate the refresh-vector. Thus applying the refresh-vector to the DSM signature register 22 will not counter the effects of the refresh operation. The post-refresh signature vector will reflect the improperly executed refresh operation, and the resulting signature vector will not equal the pre-refresh signature vector. Accordingly, the resulting signature vector at the end of the test will not match the expected signature vector, and an error message concerning the malfunction of the DRAM state machine 14 will be sent to the system processor (not shown).

The controller test sequences fully exercises the three state-machine controllers. In particular the DRAM State Machine 14 is sequenced through all of its operations, including the DRAM refresh operation, and the result is a deterministic signature vector, that is, a signature vector which reveals whether the DRAM controller is operating properly in all of its operations. This feature of the test is particularly important because if all read/write operations are correctly performed and an improper refresh operation is performed it may significantly alter any data stored in the DRAM 18. Thus if the refresh operation is not tested, a malfunctioning DRAM 18 may be used to store data and the data may then be destroyed.

Figure 2:
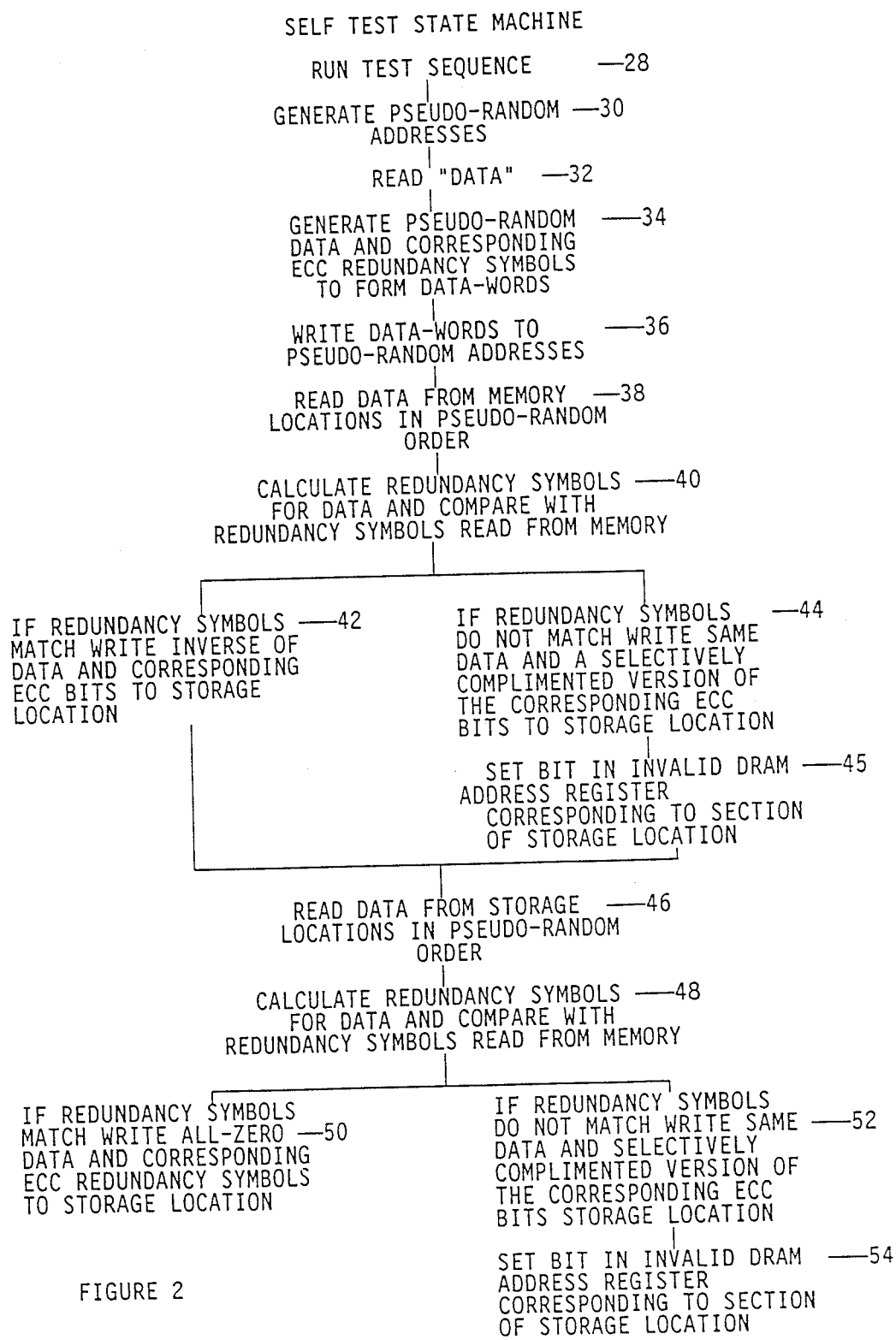
FIG. 2 is a flow chart depicting the operations of the self test state machine shown in FIG. 1.

With reference to FIG. 2, the Self Test State Machine 16 is instructed by a processor (not shown) over the system bus 8 to run a DRAM test sequence (Step 28). The Self Test State Machine 16 then sequences the DRAM state machine 14 through three predetermined read/write cycles to test the functioning of the DRAM 18 storage locations. The sequence tests each of the DRAM multi-bit addressable storage locations and each of the component bit-storage locations.

Before the first read/write cycle, the Self Test State Machine 16 generates pseudo-random DRAM addresses and, using the generated addresses, accesses the corresponding DRAM 18 storage locations (Step 30). In the first read/write cycle the Self Test State Machine 16, through the DRAM State Machine 14, then reads the "data" stored in the DRAM 18 (Step 32). This data consists of random signals stored during power up, and thus the data is ignored. Code words, consisting of pseudo-random data generated by the Self Test State Machine 16 and corresponding ECC redundancy bits generated by the DRAM State Machine 14, are then written to the addressed locations (Steps 34–36).

The error correction code (ECC) used to generate the ECC redundancy bits is a modified Hamming Code with the property that the inverse of the ECC redundancy bits generated for a particular group of data bits protects the inverse of the data bits. The ECC used in the preferred embodiment is capable of correcting a single-bit error and detecting multiple-bit errors.

The data bits, and two parity bits generated for the address of the storage location, that is, a parity bit for the row address and a parity bit for the column address, are encoded together to produce the ECC redundancy bits. Specifically, the data and parity bits are encoded in a multi-input, multi-stage parity tree, of conventional design, such that each ECC redundancy bit is associated with an odd number of data bits. The ECC redundancy bits are then appended to the data to form code words, and the code words are recorded in the addressed memory location. With an odd number of data bits being used to generate each of the ECC redundancy bits, inverting all the data bits necessarily results in the inverse of the ECC redundancy bits. Thus inverting all the data to fully test the data bit-storage locations also fully tests the associated ECC redundancy bit-storage locations. Accordingly, read/write cycles designed specifically to force ONES and ZEROS into ECC redundancy bit storage location are eliminated.

The ECC redundancy bits are used to detect two types of errors, namely, errors in addressing the storage locations and errors in storing or retrieving data. Storage location addresses consist of both a row and a column indicator. Thus errors in addressing a storage location may be caused by inappropriately indicating the row and/or inappropriately indicating the column. Both the row indicator and the column indicator are sent over the same line to the DRAM. Thus errors caused by a malfunctioning of the address line, the line driver or the DRAM itself may occur, for example, in the row indicator and not in the column indicator. Accordingly, to fully test the addressing of the DRAM, parity check bits for both segments of the address are encoded into the ECC redundancy bits.

In the second read/write cycle the code words are read from the DRAM 18 storage locations, accessed using the same pseudo random series of addresses (Step 38) and ECC redundancy bits are generated for the retrieved code word data and the address parity bits. The DRAM State Machine 14 then compares the generated redundancy bits with the code word ECC redundancy bits to determine if there are errors in the data or the address (Step 40).

If the comparison shows that the retrieved code word is error free, the inverse of the data and the address parity bits are encoded to generate the inverse of the ECC redundancy bits. The code word formed by appending the generated ECC redundancy bits to the inverse data is then written to the associated DRAM storage location (Step 42).

If the comparison shows that the retrieved code word contains one or more errors, the Self Test State Machine 16 instructs the DRAM State Machine 14 to write the same data along with ECC redundancy bits which have been selectively complimented to the address location (Step 44). The ECC bits are selectively complimented by encoding an asserted error-flag with the data and address parity bits. The asserted error-flag is thus applied to various stages of the parity tree resulting in the bits encoded by these stages being complimented. The selectively complimented ECC bits mark the storage location as improperly operating by ensuring that encoding the (erroneous) data during subsequent read/write cycles will not result in ECC redundancy bits that match the complimented ECC bits. This prevents the labeling of a faulty storage location as properly operating. In addition, a bit corresponding to the section of the DRAM containing the storage location is set in an Invalid DRAM Address Register 25 indicating that the section contains a "bad" storage location (Step 45).

In the third read/write cycle, the code words are again read from the DRAM 18 locations accessed using the pseudo random series of addresses (Step 46). Error correction redundancy bits are again generated for the code word data and address parity bits, and the generated ECC redundancy bits are compared with the code word ECC redundancy bits (Step 48). If the comparison shows that the code word is error-free, all ZERO data and the corresponding ECC redundancy bits are written to the storage location (Step 50).

If the comparison shows that the code word contains errors, the data and selectively complimented ECC redundancy bits are written to the storage location (Step 52). Also, a bit corresponding to the storage location is set in the Invalid DRAM Address Register 25 (Step 54).

After the testing is completed, the Invalid DRAM Address Register 25 contains a pointer to sections of the DRAM containing addressable storage locations which are bad. Thereafter a system processor (not shown) may use the Invalid DRAM Address Register 25 to selectively test the labeled sections of the DRAM during system operation.

The DRAM storage location testing sequence, in just three read/write cycles, tests each multi-bit addressable storage location to determine if the location is correctly readable and writeable. The test also fully exercises each of the component bit storage locations to determine if the locations can properly store both ONES and ZEROS.

The foregoing description has been limited to a specific embodiment of this invention. It will be apparent, however, that variations and modifications may be made to the invention, with the attainment of some or all of the advantages of the invention. Therefore, it is the object of the appended claims to cover all such variations and modifications as come within the true spirit and scope of the invention.

What is claimed as new and desired to be secured by Letters Patent of the United States is:

1. A memory system comprising:
   A. a dynamic random access memory;
   B. a bus controller connected to receive data from and transfer data to a system bus;
   C. a dynamic random access memory controller for
      1. transferring data and control signals between said bus controller and said memory,
      2. performing read and write operations in said memory in response to said data and control signals, and
      3. performing refresh operations in said memory at times related to a memory timer, said refresh operations occurring asynchronously relative to the operations of said bus controller;
   D. a self-test controller for
      1. sequencing said memory controller through a predetermined series of test operations at least one of which is a refresh operation,
      2. evaluating the performance of said memory controller at the completion of said series of test operations.

2. The system of claim 1 wherein said self-test controller test operations further include:
   A. a first read sequence including retrieving data bits from a memory location in said memory;
   B. a first write sequence in the same location immediately following said first read sequence including writing predetermined data bits and corresponding error correction redundancy bits
   C. repeating said first read sequence and said first write sequence in each of the other locations in said memory;
   D. a second read sequence including
      1. retrieving data bits and error correction redundancy bits from a memory location,
      2. generating error correction redundancy bits corresponding to the retrieved data bits, and
      3. comparing said generated error correction redundancy bits with the retrieved redundancy bits;
   E. a second write sequence in the same location immediately following said second read sequence, said second write sequence including:
      1. if said generated redundancy bits match the retrieved redundancy bits, inverting the data bits, and writing the inverted data bits and error correction redundancy bits corresponding to the inverted data bits, or
      2. if said generated redundancy bits do not match the retrieved redundancy bits, writing the same data bits and a selectively complimented version of the corresponding redundancy bits;
   F. repeating said second read sequence and said second write sequence in each of the other locations in said memory;
   G. a third read sequence including repeating step D;
   H. a third write sequence in the same location immediately following said third read sequence, said third write sequence including:
      1. if said generated redundancy bits match the retrieved redundancy bits, writing predetermined data bits and error correction redundancy bits corresponding to said data bits, or
      2. if said generated redundancy bits do not match the retrieved redundancy bits, writing the same data bits and a selectively complimented version of the corresponding redundancy bits;
   I. repeating said third read sequence and said third write sequence in each of the other locations in said memory.

3. The system of claim 2 wherein said series of read and write sequences are performed in all of the addressable storage locations in said memory, said locations being read and correspondingly written in a predetermined non-sequential order.

4. The system of claim 1 wherein said memory controller includes encoding means for continuously encoding signals produced at various times by various controller nodes during said series of test operations to produce a signature vector corresponding to the controller operations.

5. The system of claim 4 wherein said memory controller further includes a processor connected to receive signals from and apply signals to said encoding means, said processor including:

A. means for storing the value of said signature vector at a predetermined point in a refresh operation;

B. computing means for computing what the value of said signature vector was at the start of the refresh operation so as to produce the stored signature vector; and C. means for applying a refresh-vector to said encoding means such that if the refresh operation is properly executed the signature vector at the completion of the refresh operation has the same value as the pre-refresh signature vector calculated by said computing means.

6. The system of claim 5 wherein said memory controller additionally includes means for storing an expected signature vector equal to the signature vector produced by said encoding means when said memory controller properly executes said series of test operations and any refresh operations.

7. The system of claim 6 wherein said system further includes means for comparing said signature vector with said expected signature vector, with any differences indicating a malfunction in said controller.

8. The system of claim 1 wherein said system further includes means for testing said bus controller by sequencing said controller through a series of test operations using a predetermined series of input vectors.

9. The system of claim 8 wherein said bus controller further includes encoding means for continuously encoding signals produced at various times by various controller nodes during said series of test operations to produce a signature vector corresponding to the controller operations.

10. The system of claim 9 wherein said bus controller additionally includes means for storing an expected signature vector equal to the signature vector produced by said encoding means when said bus controller properly executes said series of test operations.

11. The system of claim 10 wherein said system further includes means for comparing said signature vector with said expected signature vector, with any differences indicating a malfunction in said controller.

12. The system of claim 1 wherein said memory includes a plurality of addressable multi-bit memory locations, with each of said locations including a section for storing data bits and a section for storing error correction redundancy bits corresponding to the data.

13. The system of claim 12 wherein said self-test controller test operations further include:

A. a first read sequence including retrieving data bits a memory location;

B. a first write sequence in the same location immediately following said first read sequence including writing predetermined data bits and error correction redundancy bits corresponding to said data bits;

C. repeating said first read sequence and said first write sequence in each of the other locations in said memory;

D. a second read sequence including
        1. retrieving data bits and error correction redundancy bits from a memory location,
        2. generating error correction redundancy bits corresponding to the retrieved data bits, and
        3. comparing said generated error correction redundancy bits with the retrieved redundancy bits;

E. a second write sequence in the same location immediately following said read sequence, said second write sequence including:
        1. if said generated redundancy bits match the retrieved redundancy bits, inverting the data bits, and writing the inverted data bits and error correction redundancy bits corresponding to the inverted data bits, or
        2. if said generated redundancy bits do not match the retrieved redundancy bits, writing the same data bits and a selectively complimented version of the corresponding redundancy bits;

F. repeating said second read sequence and said second write sequence in each of the other locations in said memory;

G. a third read sequence including repeating the second read sequence;

H. a third write sequence in the same location immediately following said third read sequence, said third write sequence including:
        1. if said generated redundancy bits match the retrieved redundancy bits, predetermined data bits and error correction redundancy bits corresponding to said data bits or
        2. if said generated redundancy bits do not match the retrieved redundancy bits, writing the same data bits and a selectively complimented version of the corresponding redundancy bits;

I. repeating said third read sequence and said third write sequence in each of the other locations in said memory.

14. The system of claim 13 wherein said memory controller includes encoding means for continuously encoding signals produced at various times by various controller nodes during said series of test operations to produce a signature vector corresponding to the controller operations.

15. The system of claim 14 wherein said memory controller further includes a processor connected to receive signals from and apply signals to said encoding means, said processor including:

A. means for storing the value of said signature vector at a predetermined point in a refresh operation;

B. computing means for computing what the value of said signature vector was at the start of the refresh operation so as to produce the stored signature vector; and C. means for applying a refresh-vector to said encoding means such that if the refresh operation is properly executed the signature vector at the completion of the refresh operation has the same value as the pre-refresh signature vector calculated by said computing means.

16. The system of claim 15 wherein said memory controller additionally includes means for storing an expected signature vector equal to the signature vector produced by said encoding means when said memory controller properly executes said series of test operations and any refresh operations.

17. The system of claim 16 wherein said system further includes means for comparing said signature vector with said expected signature vector, with any differences indicating a malfunction in said controller.

18. The system of claim 13 wherein said system further includes means for testing said bus controller by sequencing said controller through a series of test operations using a predetermined series of input vectors.

19. The system of claim 18 wherein said bus controller further includes encoding means for continuously encoding signals produced at various times by various controller nodes during said series of test operations to produce a signature vector corresponding to the controller operations.

20. The system of claim 19 wherein said bus controller additionally includes means for storing an expected signature vector equal to the signature vector produced by said encoding means when said bus controller properly executes said series of test operations.

21. The system of claim 20 wherein said system further includes means for comparing said signature vector with said expected signature vector, with any differences indicating a malfunction in said controller.

22. A method for testing a dynamic random access memory including the steps of:
   A. sequencing a memory controller through a predetermined series of test operations at least one of which is a refresh operation,
   B. continuously encoding signals produced at various times by various controller nodes during said series of test operations to produce a signature vector corresponding to the controller operations;
   C. when said memory controller is sequencing through a refresh operation, applying a refresh-vector to said signature vector such that said signature vector is the same after the refresh operation as before the refresh operation; and
   D. evaluating the performance of said memory controller at the completion of said series of test operations by examining said signature vector.

23. The method of claim 22, wherein said method further includes:
   A. a first reading step including retrieving data bits from a memory location in said memory;
   B. a first writing step including generating error correction redundancy bits for predetermined data and writing said data and said error correction redundancy bits in the same location immediately following said first reading step;
   C. repeating said first reading step and said first writing step in each of the other locations in said memory;
   D. a second reading step including:
      1. retrieving data bits and error correction redundancy bits from a memory location,
      2. generating error correction redundancy bits corresponding to the retrieved data bits, and
      3. comparing said generated error correction redundancy bits with the retrieved redundancy bits;
   E. a second writing step in the same location immediately following said second reading step including:
      1. if said generated redundancy bits match the retrieved redundancy bits, inverting the data bits, generating error correction redundancy bits corresponding to the inverted data bits, and writing the inverted data bits and the generated redundancy bits, or
      2. if said generated redundancy bits do not match the retrieved redundancy bits, writing the same data bits and a selectively complimented version of the corresponding redundancy bits;
   F. repeating said second reading step and said second writing step in each of the other locations in said memory;
   G. a third reading step including repeating step D;
   H. a third writing step in the same location immediately following said third reading step including:
      1. if said generated redundancy bits match the retrieved redundancy bits, generating error correction redundancy bits corresponding to predetermined data bits and writing said data bits and said redundancy bits, or
      2. if said generated redundancy bits do not match the retrieved redundancy bits, writing the same data bits and a selectively complimented version of the corresponding redundancy bits;
   I. repeating said third reading step and said third writing step in each of the other locations in said memory.

24. The method of claim 23 herein said testing step further includes:
   A. calculating what the value of said signature vector was at the start of the refresh operation so as to produce the stored signature vector using the value of said signature vector at a predetermined point in a refresh operation, and
   B. applying a refresh-vector to said signature vector such that if the refresh operation is properly executed the resulting signature vector at the completion of the refresh operation has the same value as the pre-refresh signature vector calculated in step A.

25. The method of claim 23 wherein said testing step further includes sequencing said memory controller through a series of test operations using a predetermined series of input vectors.

26. The method of claim 25 wherein said testing step further includes the steps of:
   A. comparing said signature vector with an expected signature vector equal to the expected value of said signature vector if the controller properly executes said test sequence, and
   B. indicating a malfunction in said controller if there are differences between said signature vector and said expected signature vector.

27. The method of claim 23 wherein said reading and writing steps are performed in all of the addressable storage locations in said memory, said locations being read and correspondingly written in a predetermined non-sequential order.

28. A method for testing a dynamic random access memory including the steps of:
   A. sequencing the memory and various memory controllers through a predetermined series of test operations at least one of which is a refresh operation using a predetermined series of input vectors, said test operations including:
      1. a first reading step including retrieving data bits from a memory location in said memory;
      2. a first writing step in the same location immediately following said first reading step including generating error correction redundancy bits for predetermined data and writing said data and said error correction redundancy bits;
      3. repeating said first reading step and said first writing step in each of the other locations in said memory;
      4. a second reading step including:
         i. retrieving data bits and error correction redundancy bits from a memory location,
         ii. generating error correction redundancy bits corresponding to the retrieved data bits, and iii. comparing said generated error correction redundancy bits with the retrieved redundancy bits;
5. a second writing step in the same location immediately following said second reading step including:
   i. if said generated redundancy bits match the retrieved redundancy bits, inverting the data bits, generating error correction redundancy bits corresponding to the inverted data bits, and writing the inverted data bits and the generated redundancy bits, or
   ii. if said generated redundancy bits do not match the retrieved redundancy bits, writing the same data bits and a selectively complimented version of the corresponding redundancy bits;
6. repeating said second reading step and said second writing step in each of the other locations in said memory;
7. a third reading step including repeating step 4;
8. a third writing step in the same location immediately following said third reading step including:
   i. if said generated redundancy bits match the retrieved redundancy bits, generating error correction redundancy bits corresponding to predetermined data bits and writing said data bits and said redundancy bits, or
   ii. if said generated redundancy bits do not match the retrieved redundancy bits, writing the same data bits and a selectively complimented version of the redundancy bits;
9. repeating said third reading step and said third writing step in each of the other locations in said memory.
B. continuously encoding signals produced at various times by various controller nodes during said series of test operations to produce signature vectors corresponding to the operations of the controllers;
C. modifying said test refresh operation to include:
   1. calculating what the value of said signature vector corresponding to the controller involved in refresh operations was at the start of the refresh operation based on the value of said signature vector at a predetermined point in the refresh operation, and
   2. applying a refresh-vector to said signature vector such that if the refresh operation is properly executed the resulting signature vector at the completion of the refresh operation has the same value as the prerefresh signature vector calculated in step C1; and
D. evaluating the performance of the controllers at the completion of said series of test operations, said evaluating step including:
   1. comparing said signature vectors with corresponding expected signature vectors equal to the expected values of said signature vectors if the controllers properly execute said test sequence, and
   2. indicating a malfunction in said controllers if there are differences between said signature vectors and said corresponding expected signature vectors.

* * * * *